(12) United States Patent
Hamada et al.

(10) Patent No.: US 7,479,734 B2
(45) Date of Patent: Jan. 20, 2009

(54) DISPLAY INCLUDING EMISSION LAYER

(75) Inventors: Yuji Hamada, Nara (JP); Tsuyoshi Tsujioka, Osaka (JP); Noriyuki Matsusue, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/526,058

(22) Filed: Sep. 25, 2006

(65) Prior Publication Data
US 2007/0013299 A1 Jan. 18, 2007

Related U.S. Application Data

(62) Division of application No. 10/252,834, filed on Sep. 24, 2002, now Pat. No. 7,151,340.

(30) Foreign Application Priority Data
Sep. 28, 2001 (JP) ............................. 2001-298739

(51) Int. Cl.
*H01J 1/62* (2006.01)
*H01J 63/04* (2006.01)

(52) U.S. Cl. .................. 313/505; 313/504; 313/506; 345/82; 315/169.3

(58) Field of Classification Search ......... 313/448–512; 345/82; 315/169.3
See application file for complete search history.

(56) References Cited

U.S. PATENT DOCUMENTS

| 5,400,047 A | 3/1995 | Beesely |
| 6,607,413 B2 | 8/2003 | Stevenson et al. |
| 6,628,067 B2 * | 9/2003 | Kobayashi et al. .......... 313/504 |
| 2001/0022496 A1 * | 9/2001 | Kobayashi et al. .......... 313/504 |

FOREIGN PATENT DOCUMENTS

| JP | 3-22304 | 3/1991 |
| JP | 5-1198 | 1/1993 |
| JP | 05-217674 | 8/1993 |
| JP | 05-226076 | 9/1993 |
| JP | 06-223969 | 8/1994 |
| JP | 2000-357584 | 12/2000 |
| JP | 2001-085158 | 3/2001 |
| JP | 2001-85158 | 3/2001 |
| JP | 2001-109398 | 4/2001 |

* cited by examiner

*Primary Examiner*—Nimeshkumar D Patel
*Assistant Examiner*—Thomas A Hollweg
(74) *Attorney, Agent, or Firm*—McDermott Will & Emery LLP

(57) ABSTRACT

A display capable of preventing an emission layer from deterioration resulting from temperature rise of an electrode also when the same is increased in size and easily connectable with an external current source also when the same is connected with the external current source on a single portion is provided. This display comprises a first electrode formed on a substrate, an emission layer formed on the first electrode, a second electrode formed on the emission layer, a peripheral electrode, arranged to enclose the outer periphery of the second electrode and connected with at least three edges of the outer periphery of the second electrode, having a smaller sheet resistance value than the second electrode, and a current source connection terminal connected to the outer periphery of the peripheral electrode. Thus, current readily flows from the second electrode toward the peripheral electrode, while the current can be dispersedly fed along three or four directions.

4 Claims, 6 Drawing Sheets

DISPLAY INCLUDING EMISSION LAYER

RELATED APPLICATIONS

This application is a divisional of application Ser. No. 10/252,834, filed Sep. 24, 2002, now U.S. Pat. No. 7,151,340 which claims priority of Japanese Patent application No. JP2001-298739, filed Sep. 28, 2001, the contents of which are herewith incorporated by reference.

BACKGROUND OF THE INVENTION

1. Field of the Invention

The present invention relates to a display, and more specifically, it relates to a display including an emission layer such as an organic layer.

2. Description of the Background Art

Requirement for flat display devices exhibiting smaller power consumption than a generally employed CRT is recently increased following diversification of information apparatuses. Among such flat display devices, a display employing an organic electroluminescence element (hereinafter referred to as an organic EL element) characterized by high efficiency, thinness/lightweight property and no view angle dependency is actively researched and developed.

FIG. 12 is a perspective view showing the overall structure of a conventional organic EL display. FIG. 13 is a plan view of the conventional organic EL display shown in FIG. 12. Referring to FIGS. 12 and 13, anodes 102 of ITO (indium-tin oxide) are formed on a glass substrate 101 in the conventional organic EL display. Organic layers 105 including hole injection layers, hole transport layers and emission layers are formed on the anodes 102. A cathode 103 is formed on the organic layers 105. This cathode 103 is provided with an outlet terminal 104.

Drive circuits 106a and 106b are formed on the glass substrate 101. Video signal lines 151 are connected to the drive circuit 106a. Scanning lines 152 and power supply lines 153 are connected to the drive circuit 106b. The outlet terminal 104 of the cathode 103 is connected to a current supply input terminal 108 for supplying current from a current source. The cathode 103 is formed to cover a plurality of pixels. Therefore, current for driving the plurality of pixels concentrically flows into the cathode 103.

As hereinabove described, the current for driving the plurality of pixels flows into the cathode 103 in the conventional organic EL display. In this case, the current concentrates to the outlet terminal 104 of the cathode 103, disadvantageously leading to resistance heating of the outlet terminal 104. Particularly when the organic EL display is increased in size, large current flows to the outlet terminal 104 to increase resistance heating thereof.

When resistance heating of the outlet terminal 104 is increased, the temperature of the cathode 103 is increased to disadvantageously deteriorate the organic layers 105 located under the cathode 103.

In general, therefore, various methods are proposed in order to suppress heat generation in an outlet terminal part. For example, Japanese Patent Laying-Open No. 2001-109398 proposes a structure increasing the width of an outlet terminal part.

Even if the width of a single outlet terminal part is increased, however, large current concentrically flows to the single outlet terminal part when the display is increased in size, and hence it is difficult to reduce the quantity of heat generation in the outlet terminal part. When the display is increased in size, therefore, it is so difficult to reduce temperature rise of a cathode that it is also difficult to prevent organic layers from deterioration resulting from temperature rise of the cathode.

Japanese Patent Laying-Open No. 2001-85158 discloses a technique of increasing the width of outlet terminal (drawing terminal) parts of a cathode (second electrode) while providing the outlet terminal parts on two portions of opposite edges. In general, however, connection with an external current source is performed on a single portion and hence it is difficult to connect the outlet terminals of the cathode (second electrode) with the external current source when the outlet terminals are provided on two portions of the opposite edges. In the structure disclosed in the aforementioned gazette, further, current can be dispersed to the two outlet terminals (two directions) of the cathode. However, it is difficult to disperse the current in three or four directions. When large current flows in a display increased in size, therefore, it is difficult to disperse the current for inhibiting the cathode from heat generation.

SUMMARY OF THE INVENTION

An object of the present invention is to provide a display capable of preventing an emission layer (organic layer) from deterioration resulting from temperature rise of an electrode also when the display is increased in size and easily connectable with an external current source also when the display is connected with the external current source on a single portion.

Another object of the present invention to inhibit a current source connection terminal connected with the external current source from transferring heat to the electrode in the aforementioned display.

In order to attain the aforementioned objects, a display according to an aspect of the present invention comprises a first electrode formed on a substrate, an emission layer formed on the first electrode, a second electrode formed on the emission layer, a peripheral electrode, arranged to enclose the outer periphery of the second electrode and connected with at least three edges of the outer periphery of the second electrode, having a smaller sheet resistance value than the second electrode, and a current source connection terminal connected to the outer periphery of the peripheral electrode.

The display according to this aspect is provided with the peripheral electrode, arranged to enclose the outer periphery of the second electrode and connected with at least three edges of the outer periphery of the second electrode, having a smaller sheet resistance value than the second electrode as hereinabove described, whereby current readily flows from the second electrode toward the peripheral electrode and this current can be dispersedly fed in three or four directions. Thus, heat generation of the second electrode can be further suppressed as compared with a case of dispersedly feeding the current along two directions of the second electrode. Consequently, the emission layer can be effectively prevented from deterioration resulting from heat generation (temperature rise) of the second electrode also when the display is increased in size. The current source connection terminal is connected to the outer periphery of the peripheral electrode arranged to enclose the outer periphery of the second electrode so that the second electrode and the single current source connection terminal can be easily electrically connected with each other through the peripheral electrode. Consequently, the display can be easily connected with the external current source through the single current source connection terminal also when connected with the external current source on a single portion. The current source connection terminal is provided on the outer periphery of the peripheral electrode for increasing the distance between the current source connection terminal and the second electrode by the width of the peripheral electrode, whereby heat generated in the current source connection terminal is hardly transferred to the second electrode. Thus, the second electrode is inhibited from temperature rise, whereby the emission layer can be inhibited from deterioration resulting from temperature rise of the second electrode.

In the display according to the aforementioned aspect, the peripheral electrode may be annularly formed. Further, the peripheral electrode may be formed to be in contact with the side surface of the outer periphery of the second electrode. The peripheral electrode having a smaller sheet resistance value than the second electrode preferably contains at least one of Mg, Ti and Al. When employing such a material, the peripheral electrode having a smaller sheet resistance value than the second electrode can be easily formed. Further, only a single current source connection terminal may be provided.

In the display according to the aforementioned aspect, the peripheral electrode is preferably connected with three edges of the second electrode other than an edge of the second electrode corresponding to an edge of the peripheral electrode connected with the current source connection terminal, and an opening is preferably formed between the edge of the peripheral electrode connected with the current source connection terminal and the corresponding edge of the second electrode. According to this structure, heat generated in the current source connection terminal is further hardly transferred to the second electrode, due to the opening. Thus, the emission layer can be further inhibited from deterioration resulting from temperature rise of the second electrode.

In the display according to the aforementioned aspect, the contact area between the second electrode and the peripheral electrode is preferably increased as receding from the current source connection terminal. According to this structure, the second electrode can be further effectively prevented from transfer of heat readily generated in the current source connection terminal. Thus, the second electrode can be prevented from temperature rise, whereby the emission layer can be prevented from deterioration resulting from temperature rise of the second electrode.

In this case, an opening is preferably formed in an edge of the second electrode closest to the current source connection terminal, two edges of the second electrode secondly closest to the current source connection terminal are preferably in contact with corresponding edges of the peripheral electrode through a plurality of outlet terminals provided on the two edges of the second electrode, and an edge of the second electrode farthest from the current source connection terminal is preferably totally in contact with a corresponding edge of the peripheral electrode. According to this structure, the second electrode and the peripheral electrode are in contact with each other on three edges of the second electrode and corresponding three edges of the peripheral electrode, whereby current dispersedly flows from the second electrode toward the peripheral electrode along three directions. Thus, heat generation of the second electrode can be further suppressed as compared with a case where the current dispersedly flows along two directions of the second electrode. Thus, the emission layer can be prevented from deterioration resulting from temperature rise of the second electrode. In this case, the plurality of outlet terminals may be formed by projecting portions of irregular shapes provided on the two edges of the second electrode secondly closest to the current source connection terminal.

In the display according to the aforementioned aspect, the peripheral electrode is preferably formed to be connected with four edges of the outer periphery of the second electrode. According to this structure, current can be uniformly dispersedly fed from the second electrode toward the peripheral electrode along four directions. Thus, the quantity of heat generated in the second electrode can be reduced as compared with a case where the current dispersedly flows along two directions of the second electrode.

In the aforementioned structure having the peripheral electrode connected with the four edges of the outer periphery of the second electrode, the peripheral electrode is preferably formed to be in contact substantially with the overall surfaces of the four edges of the outer periphery of the second electrode. According to this structure, current further readily flows from the second electrode toward the peripheral electrode along four directions, whereby the current can be more uniformly dispersedly fed. Thus, the quantity of heat generated in the second electrode can be further reduced as compared with a case where the current dispersedly flows along two directions of the second electrode.

In the aforementioned structure having the peripheral electrode connected with the four edges of the outer periphery of the second electrode, an edge of the second electrode corresponding to an edge of the peripheral electrode connected with the current source connection terminal preferably includes a plurality of outlet terminals, the plurality of outlet terminals are preferably connected to the edge of the peripheral electrode connected with the current source connection terminal, and the peripheral electrode is preferably formed to be in contact substantially with the overall surfaces of remaining three edges of the second electrode. According to this structure, the second electrode and the peripheral electrode are connected with each other on four edges, whereby current can be dispersedly fed from the second electrode to the peripheral electrode along four directions. Thus, heat generation of the second electrode can be further suppressed as compared with a case where the current is dispersed along two directions of the second electrode. Consequently, the emission layer can be effectively prevented from deterioration resulting from heat generation (temperature rise) of the second electrode also when the display is increased in size. The plurality of outlet terminals provided on the edge of the second electrode are connected to the edge of the peripheral electrode connected with the current source connection terminal so that the contact area between the plurality of outlet terminals and the edge of the peripheral electrode is reduced as compared with a case where one edge of the second electrode and one edge of the peripheral electrode are totally in contact with each other, whereby heat generated in the current source connection terminal is further hardly transferred to the second electrode. Thus, the second electrode can be inhibited from temperature rise, whereby the emission layer can be prevented from deterioration resulting from temperature rise of the second electrode. In this case, the plurality of outlet terminals may be formed by projecting portions of an irregular shape provided on the edge of the second electrode corresponding to the edge of the peripheral electrode connected with the current source connection terminal.

In the aforementioned structure having the peripheral electrode connected with the four edges of the outer periphery of the second electrode, the second electrode preferably includes a plurality of outlet terminals formed along four edges of the outer periphery of the second electrode, and the peripheral electrode is preferably connected with the four edges of the second electrode through the plurality of outlet terminals. According to this structure, the second electrode and the peripheral electrode are connected with each other on four edges, whereby current can be uniformly dispersedly fed from the second electrode toward the peripheral electrode along four directions. Thus, heat generation of the second electrode can be further suppressed as compared with a case where the current dispersedly flows along two directions of the second electrode. Consequently, the emission layer can be effectively prevented from deterioration resulting from heat generation (temperature rise) of the second electrode also when the display is increased in size. The plurality of outlet terminals provided on the four edges of the second electrode are connected to four edges of the peripheral electrode so that the contact areas between the plurality of outlet terminals and the four edges of the peripheral electrode are reduced as compared with a case of totally brining the four edges of the second electrode and the four edges of the peripheral electrode into contact with each other, whereby heat generated in the current source connection terminal is further hardly transferred to the second electrode. Thus, temperature rise of the second electrode can be suppressed, whereby the emission layer can be prevented from deterioration resulting from temperature rise of the second electrode. In this case, the plurality of outlet terminals may be formed by projecting portions of irregular shapes provided on the four edges of the peripheral electrode.

The display according to the aforementioned aspect preferably further comprises cooling means provided in the vicinity of the current source connection terminal. According to this structure, the cooling means can effectively suppress heat generation of the current source connection terminal readily subjected to concentration of current. Thus, the quantity of heat transferred from the current source connection terminal to the second electrode through the peripheral electrode can be reduced, whereby the emission layer can be further inhibited from deterioration resulting from temperature rise of the second electrode. In this case, the cooling means preferably includes at least one of a fan, a cooling fin and a Peltier device. According to this structure, the current source connection terminal readily subjected to concentration of current can be easily inhibited from heat generation.

In the display according to the aforementioned aspect, the emission layer preferably includes an organic layer. According to this structure, the organic layer can be inhibited from deterioration resulting from temperature rise of the second electrode in an organic EL element including the organic layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
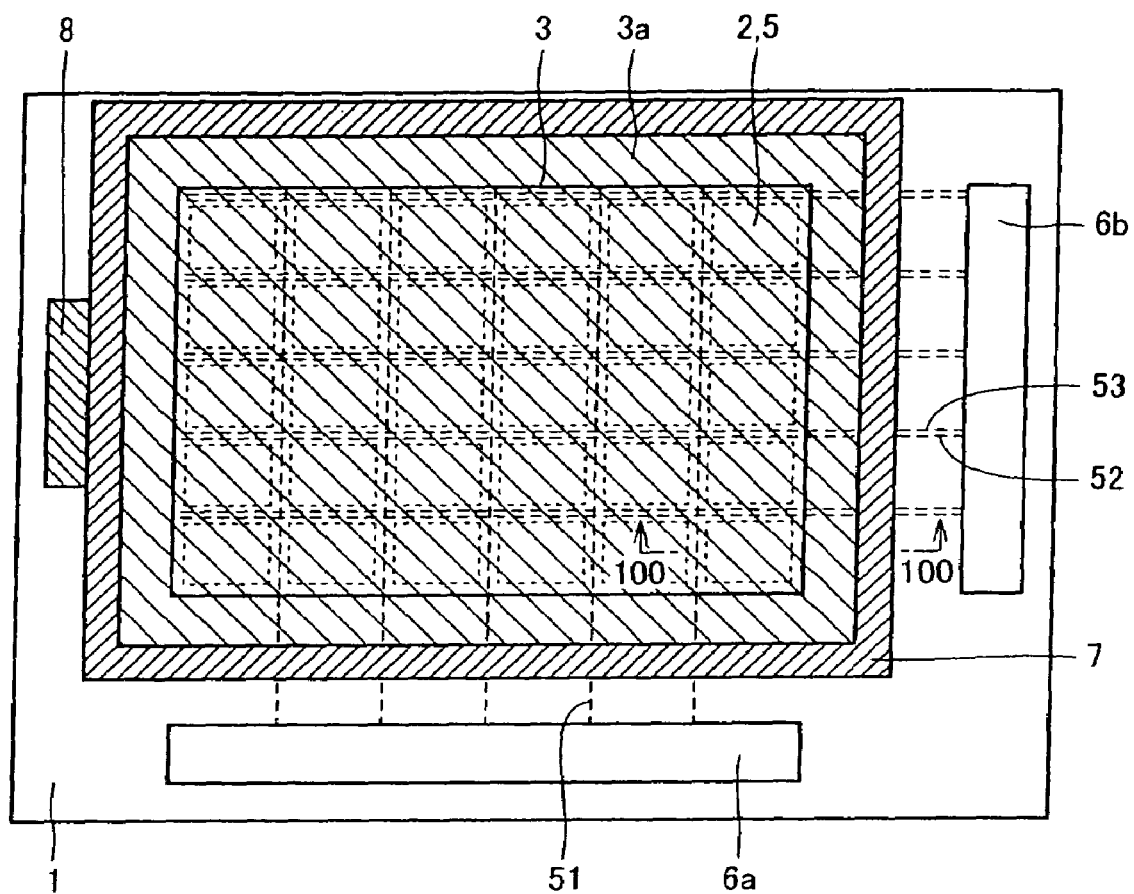
FIG. 1 is a plan view showing the overall structure of an organic EL display according to a first embodiment of the present invention.
Figure 2:
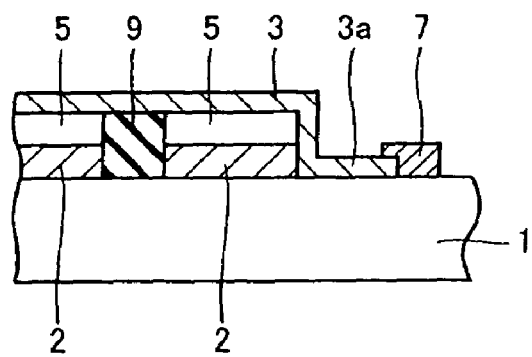
FIG. 2 is a sectional view of the organic EL display according to the first embodiment taken along the line 100-100 in FIG. 1.

Referring to FIGS. 1 and 2, anodes 2 consisting of transparent metal oxide films of ITO (indium-tin oxide) or the like having a thickness of about 100 nm are formed on a glass substrate 1 in an organic EL display according to a first embodiment of the present invention. Organic layers 5 are formed on the anodes 2. The organic layers 5 consist of hole injection layers formed on the anodes 2, hole transport layers formed on the hole injection layers and emission layers formed on the hole transport layers. A cathode 3 consisting of a low work function material such as MgIn having a thickness of about 300 nm is formed on the organic layers 5 to cover the overall structure.

The glass substrate 1 is an example of the "substrate" according to the present invention. The anodes 2 are examples of the "first electrode" according to the present invention, and the cathode 3 is an example of the "second electrode" according to the present invention. The organic layers 5 are examples of the "emission layer" according to the present invention.

According to the first embodiment, an annular peripheral electrode 7 of Mg having a smaller sheet resistance value than the cathode 3 is formed to enclose the outer periphery 3a of the cathode 3. This annular peripheral electrode 7 is formed to be in contact with the side surfaces of all four edges of the outer periphery 3a of the cathode 3. The annular peripheral electrode 7 is formed to be in contact with the upper surface of the glass substrate 1. A current supply input terminal 8 connected with an external current source is connected to the outer periphery of the peripheral electrode 7. The current supply input terminal 8 is an example of the "current source connection terminal" according to the present invention.

Drive circuits 6a and 6b are arranged on the glass substrate 1. Video signal lines 51 are connected to the drive circuit 6a. Scanning lines 52 and power supply lines 53 are connected to the drive circuit 6b. An insulator 9 is embedded between each adjacent pair of pixels, as shown in FIG. 2.

According to the first embodiment, as hereinabove described, the annular peripheral electrode 7 consisting of the material having a smaller sheet resistance value than the cathode 3 is provided to be connected with all four edges of the outer periphery 3a of the cathode 3, whereby current readily flows from the cathode 3 toward the peripheral electrode 7 and this current can be uniformly dispersedly fed along four directions. Thus, heat generation of the cathode 3 can be further suppressed as compared with a case where the current dispersedly flows along two directions of the cathode 3. Consequently, the emission layers can be effectively prevented from deterioration resulting from heat generation (temperature rise) of the cathode 3 also when the organic EL display is increased in size.

According to the first embodiment, the current supply input terminal 8 connected with the external current source is provided on the outer periphery of the annular peripheral electrode 7 arranged to enclose the outer periphery 3a of the cathode 3, whereby the cathode 3 can be easily electrically connected with the single current supply input terminal 8 through the annular peripheral electrode 7. Consequently, the organic EL display can be easily connected with the external current source through the single current supply input terminal 8 also when connected with the external current source on a single portion.

According to the first embodiment, the current supply input terminal 8 is provided on the outer periphery of the peripheral electrode 7 for increasing the distance between the current supply input terminal 8 and the cathode 3 by the width of the peripheral electrode 7, whereby heat generated in the current supply input terminal 8 readily subjected to concentration of current is hardly transferred to the cathode 3. Thus, the organic layers 5 can be inhibited from deterioration resulting from temperature rise of the cathode 3.

Second Embodiment

Figure 3:
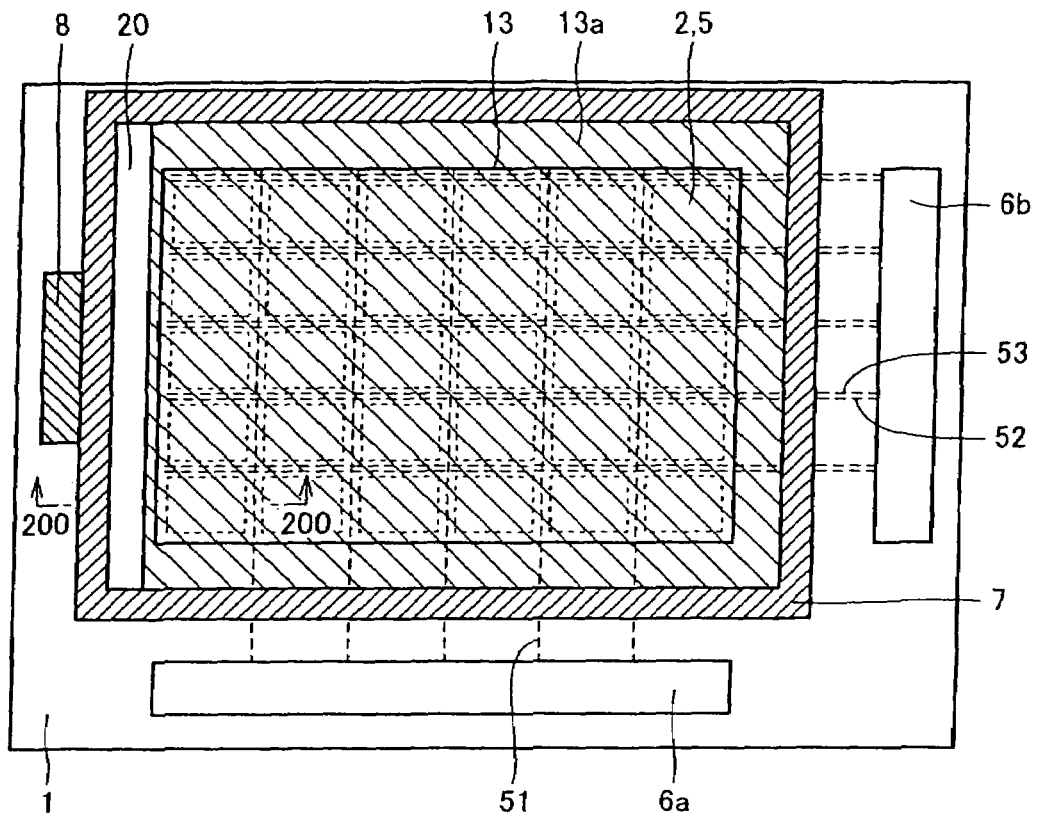
FIG. 3 is a plan view showing the overall structure of an organic EL display according to a second embodiment of the present invention.
Figure 4:
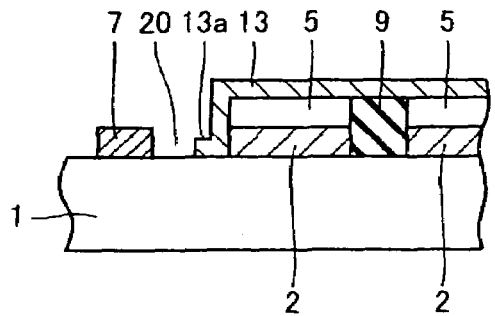
FIG. 4 is a sectional view of the organic EL display according to the second embodiment taken along the line 200-200 in FIG. 3.
Figure 5:
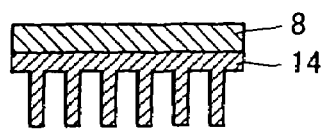
FIG. 5 is a sectional view showing cooling means for a current supply input terminal of the organic EL display according to the second embodiment shown in FIG. 3.

Referring to FIGS. 3 to 5, an opening 20 is provided between an edge of a peripheral electrode 7 connected with a current supply terminal 8 and a corresponding edge of a cathode 13 in an organic EL display according to a second embodiment of the present invention while mounting a cooling fin 14 on the current supply terminal 8 in a structure similar to that of the first embodiment shown in FIG. 1. The remaining structure of the organic EL display according to the second embodiment is similar to that of the aforementioned organic EL display according to the first embodiment. The organic EL display according to the second embodiment is now described in detail.

In the organic EL display according to the second embodiment, anodes 2 of ITO or the like are formed on a glass substrate 1, similarly to the aforementioned first embodiment. Organic layers 5 consisting of hole injection layers, hole transport layers and emission layers in ascending order are formed on the anodes 2. An insulator 9 is embedded between each adjacent pair of pixel parts.

The cathode 13 is formed to cover a plurality of pixel parts. The cathode 13 is an example of the "second electrode" according to the present invention. The annular peripheral electrode 7 of a material (Mg) having a lower sheet resistance value than the cathode 13 is formed to enclose the cathode 13. The current supply input terminal 8 is connected to one edge of the outer periphery of the peripheral electrode 7.

According to the second embodiment, the opening 20 is formed between the edge of the peripheral electrode 7 connected with the current supply input terminal 8 and the corresponding edge of the cathode 13. Side surfaces of three edges of the outer periphery 13a of the cathode 13 and corresponding three edges of the peripheral electrode 7 are totally in contact with each other. The peripheral electrode 7 is formed to be in contact with the upper surface of the glass substrate 1. According to the second embodiment, the cooling fin 14 is provided under the current supply input terminal 8, as shown in FIG. 5. The cooling fin 14 is an example of the "cooling means" according to the present invention.

According to the second embodiment, as hereinabove described, the opening 20 is so provided that the cathode 13 can be effectively prevented from transfer of heat generated in the current supply input terminal 8 readily subjected to concentration of current. Thus, the cathode 13 can be prevented from temperature rise, whereby the organic layers 5 can be inhibited from deterioration resulting from temperature rise of the cathode 13.

According to the second embodiment, three edges of the outer periphery 13a of the cathode 13 are totally in contact with three edges of the peripheral electrode 7, whereby current can be dispersedly fed from the cathode 13 to the peripheral electrode 7 along three directions. Thus, heat generation of the cathode 13 can be further suppressed as compared with a case where the current dispersedly flows along two directions of the cathode 13. Consequently, the organic layers 5 can be effectively prevented from deterioration resulting from heat generation (temperature rise) of the cathode 13 also when the organic EL display is increased in size.

According to the second embodiment, further, the cooling fin 14 is provided under the current supply input terminal 8, whereby heat generation of the current supply input terminal 8 readily subjected to concentration of current can be effectively suppressed. Consequently, the quantity of heat transferred from the current supply input terminal 8 to the cathode 13 through the peripheral electrode 7 can be reduced. Thus, the organic layers 5 can be further inhibited from deterioration resulting from temperature rise of the cathode 13.

According to the second embodiment, in addition, the current supply input terminal 8 connected with the external current source is provided on the outer periphery of the annular peripheral electrode 7 arranged to enclose the outer periphery 13a of the cathode 13, whereby the cathode 13 can be easily electrically connected with the single current supply input terminal 8 through the annular peripheral electrode 7. Consequently, the organic EL display can be easily connected with the external current source through the single current supply input terminal 8 also when connected with the external current source on a single portion.

Third Embodiment

Figure 6:
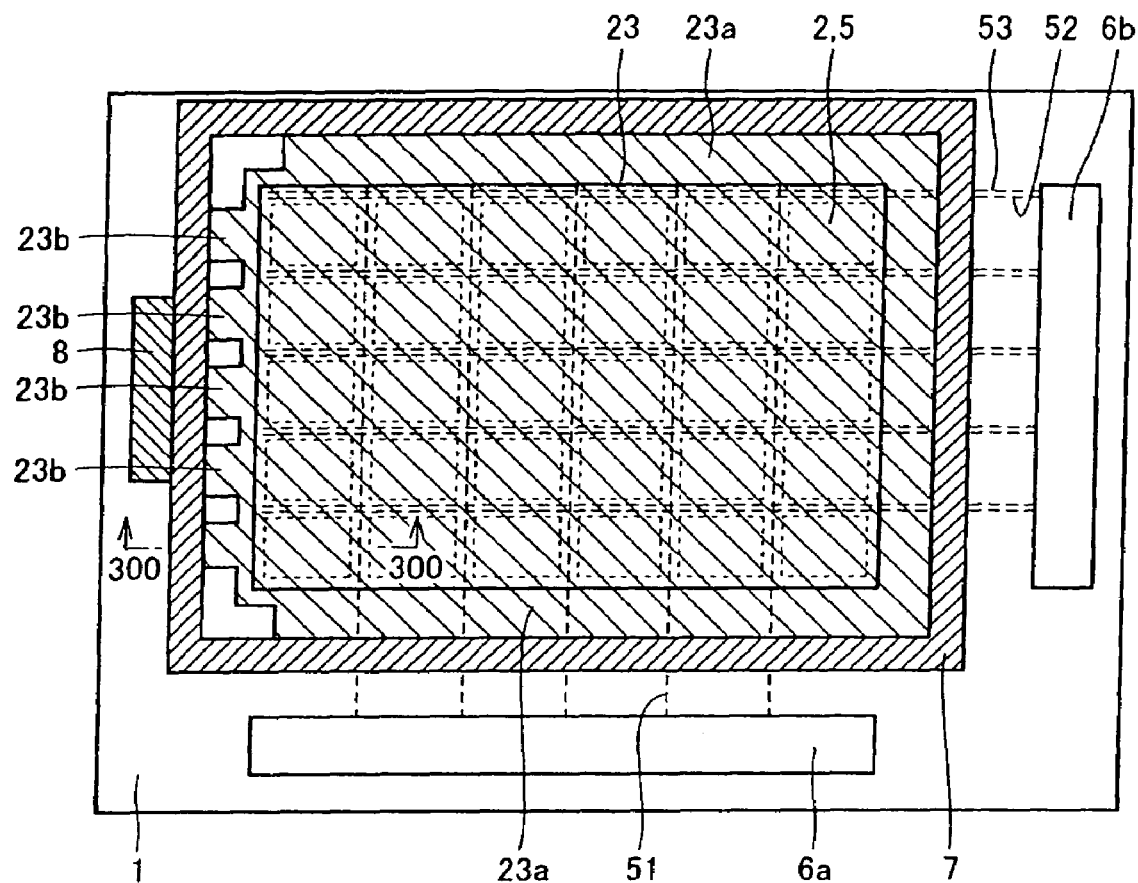
FIG. 6 is a plan view showing the overall structure of an organic EL display according to a third embodiment of the present invention.
Figure 7:
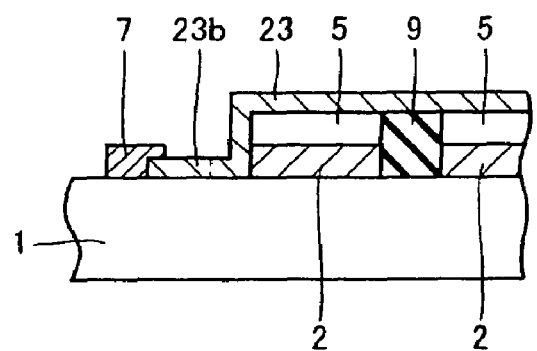
FIG. 7 is a sectional view of the organic EL display according to the third embodiment taken along the line 300-300 in FIG. 6.

Referring to FIGS. 6 and 7, a cathode 23 and a peripheral electrode 7 are totally in contact with each other on three edges of the cathode 23 while one edge of the cathode 23 is connected to the peripheral electrode 7 through a plurality of outlet terminals 23b in an organic EL display according to a third embodiment of the present invention. The remaining structure of the organic EL display according to the third embodiment is similar to that of the aforementioned organic EL display according to the first embodiment.

According to the third embodiment, an edge of the cathode 23 corresponding to an edge of the peripheral electrode 7 connected with a current supply input terminal 8 is irregularly formed for forming the plurality of outlet terminals 23b by projecting portions of the irregular shape. The edge of the peripheral electrode 7 connected with the current supply input terminal 8 is connected with one edge of the cathode 23 through the plurality of outlet terminals 23b. The remaining three edges of the outer periphery 23a of the cathode 23 are formed to be totally in contact with the peripheral electrode 7. The cathode 23 is an example of the "second electrode" according to the present invention.

According to the third embodiment, as hereinabove described, the peripheral electrode 7 and the cathode 23 are connected with each other through the overall surfaces of the three edges of the cathode 23 and the plurality of outlet terminals 23b provided on the remaining edge, whereby current flowing to the cathode 23 can be substantially uniformly fed along four directions. Thus, heat generation of the cathode 23 can be further suppressed as compared with a case where the current dispersedly flows along two directions of the cathode 23. Consequently, emission layers can be effectively prevented from deterioration resulting from heat generation (temperature rise) of the cathode 23 also when the organic EL display is increased in size.

According to the third embodiment, the edge of the peripheral electrode 7 connected with the current supply input terminal 8 and the corresponding edge of the cathode 23 are connected with each other through the plurality of outlet terminals 23b, whereby the contact area can be reduced as compared with a case of totally bringing the cathode 23 and the peripheral electrode 7 into contact with each other. Thus, the quantity of heat generated in the current supply input terminal 8 readily subjected to concentration of current and transferred to the cathode 23 can be reduced. Thus, organic layers 5 can be effectively prevented from deterioration resulting from temperature rise of the cathode 23.

According to the third embodiment, further, the current supply input terminal 8 connected with the external current source is provided on the outer periphery of the annular peripheral electrode 7 arranged to enclose the outer periphery of the cathode 23, whereby the cathode 23 can be easily electrically connected with the single current supply input terminal 8 through the annular peripheral electrode 7. Consequently, the organic EL display can be easily connected with the external current source through the single current supply input terminal 8 also when connected with the external current source on a single portion.

Fourth Embodiment

Figure 8:
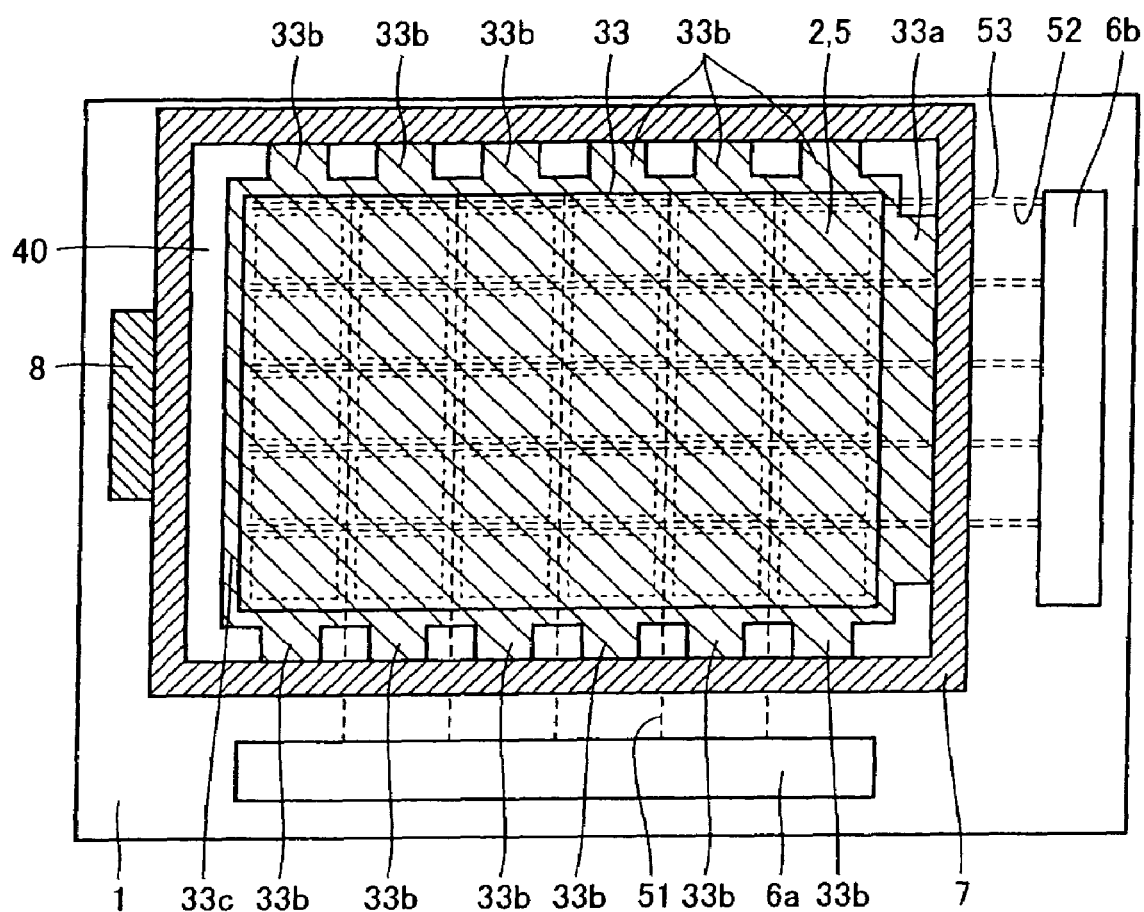
FIG. 8 is a plan view showing the overall structure of an organic EL display according to a fourth embodiment of the present invention.

Referring to FIG. 8, an opening 40 is provided between an edge of a peripheral electrode 7 connected with a current supply input terminal 8 and a corresponding edge 33c of a cathode 33 while other two edges of the cathode 33 are connected to the peripheral electrode 7 through a plurality of outlet terminals 33b and the remaining edge 33a of the cathode 33 is totally brought into contact with the peripheral electrode 7 in an organic EL display according to a fourth embodiment of the present invention. The remaining structure of the organic EL display according to the fourth embodiment is similar to that of the organic EL display according to the first embodiment. The organic EL display according to the fourth embodiment is now described in detail.

In the organic EL display according to the fourth embodiment, the opening 40 is provided between the edge of the peripheral electrode 7 connected with the current supply input terminal 8 and the corresponding edge 33c of the cathode 33. The plurality of outlet terminals 33b consisting of projecting portions of irregular shapes are formed on other two edges of the cathode 33 at prescribed intervals. These two edges of the cathode 33 and two edges of the peripheral electrode 7 are connected with each other through the plurality of outlet terminals 33b. The remaining edge 33a of the cathode 33 is totally brought into contact with the remaining edge of the peripheral electrode 7. The cathode 33 is an example of the "second electrode" according to the present invention.

According to the fourth embodiment, as hereinabove described, the contact area between the cathode 33 and the peripheral electrode 7 is increased as receding from the current supply input terminal 8. In other words, the opening 40 is formed on the edge 33c of the cathode 33 closest the current supply input terminal 8 while the two edges of the cathode 33 secondly closest thereto are connected with the peripheral electrode 7 through the plurality of outlet terminals 33b, and the edge 33a of the cathode 33 farthest from the current supply input terminal 8 is totally brought into contact with the corresponding edge of the peripheral electrode 7.

According to the fourth embodiment, as hereinabove described, the contact area between the cathode 33 and the peripheral electrode 7 is increased as receding from the current supply input terminal 8, whereby the cathode 33 can be further effectively prevented from transfer of heat readily generated in the current supply input terminal 8. Thus, the cathode 33 can be prevented from temperature rise, whereby organic layers 5 can be prevented from deterioration resulting from temperature rise of the cathode 33.

According to the fourth embodiment, further, the cathode 33 and the peripheral electrode 7 are in contact with each other on three edges of the cathode 33 and the corresponding three edges of the peripheral electrode 7, whereby current dispersedly flows from the cathode 33 toward the peripheral electrode 7 along three directions. Therefore, heat generation of the cathode 33 can be further suppressed as compared with a case where the current dispersedly flows along two directions of the cathode 33. Thus, emission layers can be prevented from deterioration resulting from temperature rise of the cathode 33.

According to the fourth embodiment, in addition, the current supply input terminal 8 connected with the external current source is provided on the outer periphery of the annular peripheral electrode 7 arranged to enclose the outer periphery of the cathode 33, whereby the cathode 33 can be easily electrically connected with the single current supply input terminal 8 through the annular peripheral electrode 7. Consequently, the organic EL display can be easily connected with the external current source through the single current supply input terminal 8 also when connected with the external current source on a single portion.

Fifth Embodiment

Figure 9:
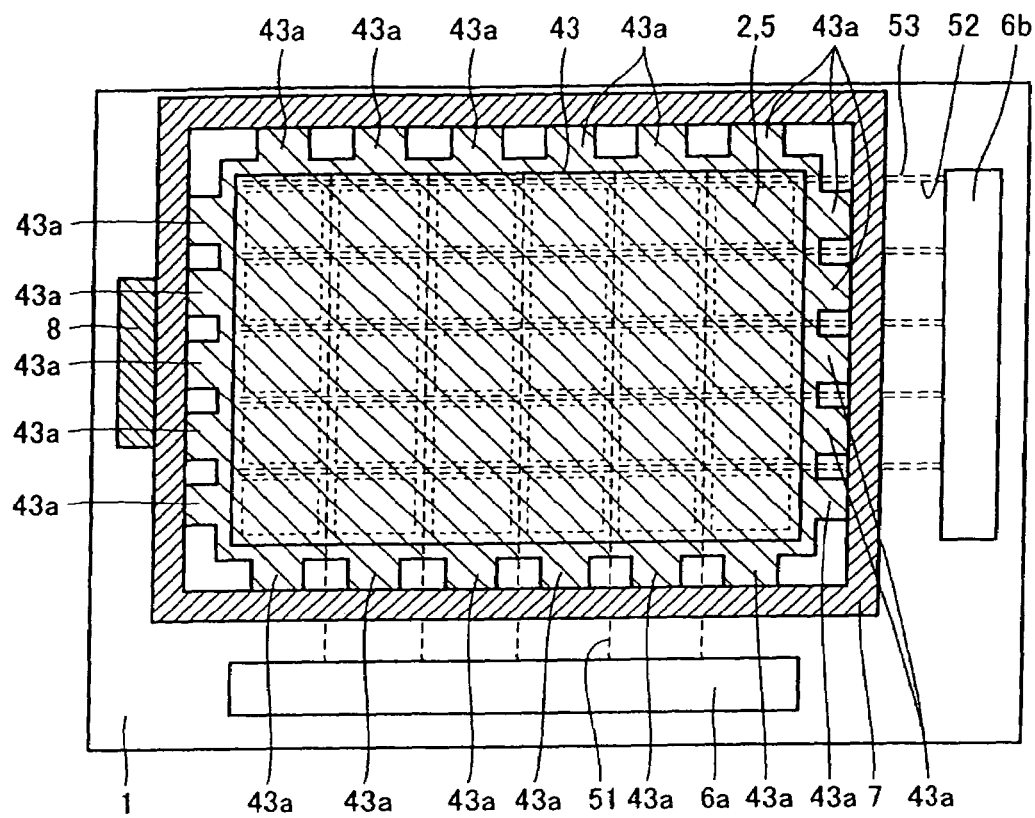
FIG. 9 is a plan view showing the overall structure of an organic EL display according to a fifth embodiment of the present invention.

Referring to FIG. 9, a plurality of outlet terminals 43a are formed on all of four edges of a cathode 43 at prescribed intervals for connecting four edges of the cathode 43 with corresponding four edges of a peripheral electrode 7 through the outlet terminals 43a in an organic EL display according to a fifth embodiment of the present invention. The remaining structure of the organic EL display according to the fifth embodiment is similar to that of the organic EL display according to the first embodiment.

According to the fifth embodiment, the plurality of outlet terminals 43a consisting of projecting portions of irregular shapes are provided at prescribed intervals along four edges of the cathode 43. Four edges of the cathode 43 are connected with the corresponding four edges of the peripheral electrode 7 through the plurality of outlet terminals 43a. The cathode 43 is an example of the "second electrode" according to the present invention.

According to the fifth embodiment, as hereinabove described, four edges of the cathode 43 are connected with the corresponding four edges of the peripheral electrode 7 through the plurality of outlet terminals 43a, whereby current flowing from the cathode 43 toward the peripheral electrode 7 can be uniformly dispersed along four directions. Thus, heat generation of the cathode 43 can be further suppressed as compared with a case where the current dispersedly flows along two directions of the cathode 43. Consequently, emission layers can be effectively prevented from deterioration resulting from heat generation (temperature rise) of the cathode 43 also when the organic EL display is increased in size.

According to the fifth embodiment, the cathode 43 and the peripheral electrode 7 are connected with each other through the plurality of outlet terminals 43a so that the contact area between the cathode 43 and the peripheral electrode 7 can be reduced as compared with a case of totally bringing the cathode 43 and the peripheral electrode 7 into contact with each other. When a current supply input terminal 8 generates heat, therefore, the heat can be rendered hardly transferable to the cathode 43. Thus, the cathode 43 can be prevented from temperature rise. Therefore, organic layers 5 can be effectively prevented from deterioration resulting from temperature rise of the cathode 43.

According to the fifth embodiment, the current supply input terminal 8 connected with an external current source is provided on the outer periphery of the annular peripheral electrode 7 arranged to enclose the outer periphery of the cathode 43 so that the cathode 43 can be easily electrically connected with the single current supply input terminal 8 through the annular peripheral electrode 7. Consequently, the organic EL display can be easily connected with the external current source through the single current supply input terminal 8 also when connected with the external current source on a single portion.

Although the present invention has been described and illustrated in detail, it is clearly understood that the same is by way of illustration and example only and is not to be taken by way of limitation, the spirit and scope of the present invention being limited only by the terms of the appended claims.

While the display according to the present invention is applied to an organic EL display in each of the aforementioned embodiments, for example, the present invention is not restricted to this but is also applicable to a display, other than the organic EL display, including emission layers.

While the peripheral electrode 7 is made of Mg in each of the aforementioned embodiments, the present invention is not restricted to this but another material may alternatively be employed so far as the sheet resistance value thereof is smaller than that of the cathode. For example, Ti or Al is conceivably employable as the material for the peripheral electrode 7. Alternatively, a binary alloy or a ternary alloy of Al—Ti, Al—Cr, Al—Mo, Al—W, Al—Ta, Al—Cu or Al—Nd may be employed.

While the anodes are arranged under the organic layers and the cathode is arranged on the organic layers in each of the aforementioned embodiments, the present invention is not restricted to this but the anodes may alternatively be arranged on the organic layers and the cathode may alternatively be arranged under the organic layers.

Figure 10:
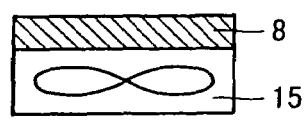
FIG. 10 is a sectional view showing a modification of the cooling means for the current supply input terminal of the organic EL display according to the second embodiment shown in FIG. 5.
Figure 11:
FIG. 11 is a sectional view showing another modification of the cooling means for the current supply input terminal of the organic EL display according to the second embodiment shown in FIG. 5.
Figure 12:
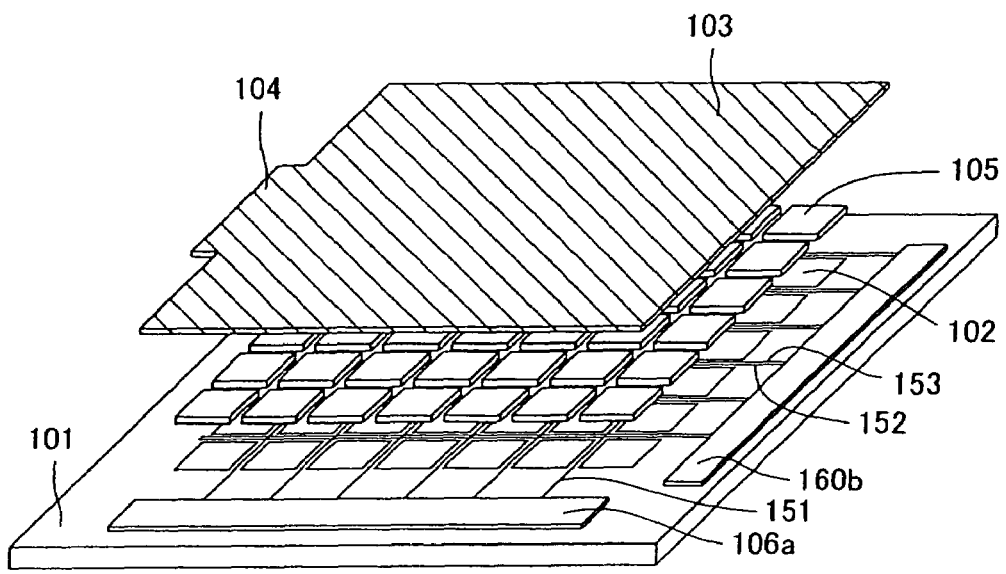
FIG. 12 is a perspective view showing the overall structure of a conventional organic EL display.
Figure 13:
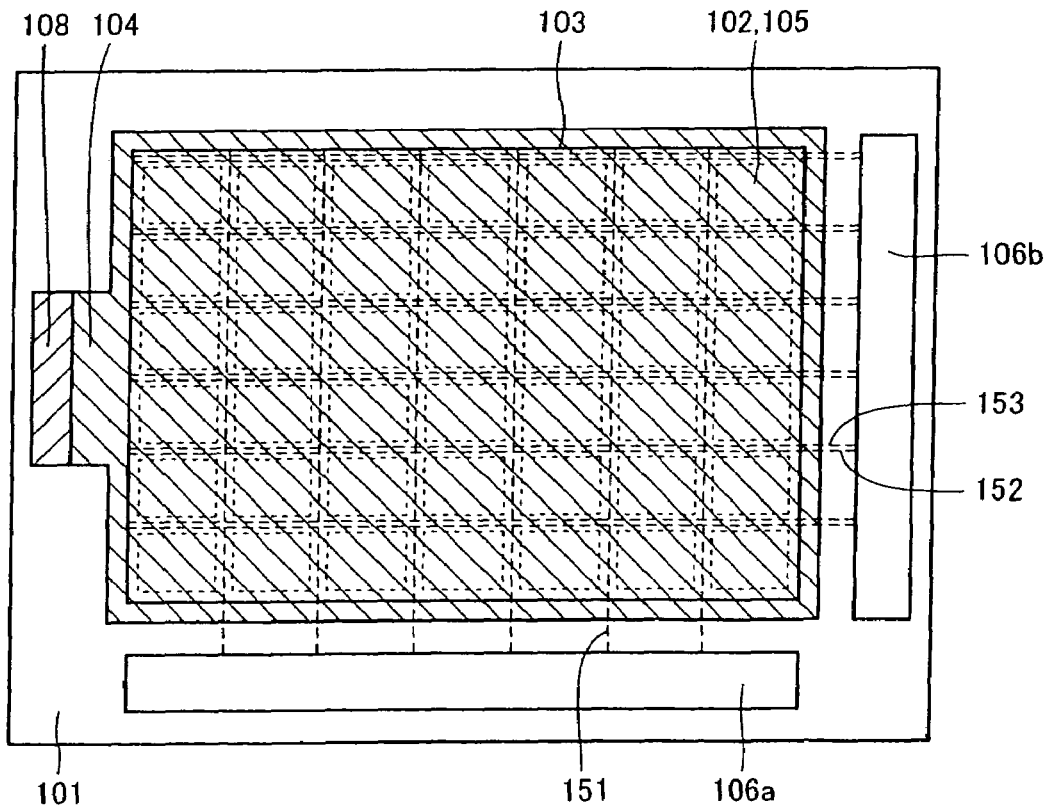
FIG. 13 is a plan view showing the overall structure of the conventional organic EL display shown in FIG. 12.

While the cooling fin 14 is employed in the aforementioned second embodiment as the cooling means for the current supply input terminal 8, the present invention is not restricted to this but another cooling means may alternatively be employed. For example, a fan 15 may be provided under a current supply input terminal 8 as shown in FIG. 10, or a Peltier device 16 may be provided as a cooling element under a current supply input terminal 8 as shown in FIG. 11. According to this structure, the current supply input terminal 8 readily generating heat due to concentration of current can be easily cooled, whereby the quantity of heat transferred from the power supply input terminal 8 to the cathode 13 through the peripheral electrode 7 can be reduced. Consequently, the organic layers 5 can be further inhibited from deterioration resulting from temperature rise of the cathode 13.

What is claimed is:

1. A display comprising:
   a first electrode formed on a substrate;
   an emission layer formed on said first electrode;
   a second electrode having an outer periphery defined by side surfaces formed on said emission layer;
   a peripheral electrode, arranged to enclose the outer periphery of said second electrode and connected with four side surfaces of the outer periphery of said second electrode, having a smaller sheet resistance value than said second electrode; and
   a current source connection terminal connected to the outer periphery of said peripheral electrode, wherein
   said second electrode is formed to cover not only an upper surface, but also a side surface of said emission layer.

2. The display according to claim 1 wherein said peripheral electrode is formed to be in contact substantially with the overall surfaces of said four side surfaces of the outer periphery of said second electrode.

3. A display comprising:
   a first electrode formed on a substrate;
   an emission layer formed on said first electrode;
   a second electrode formed on said emission layer, the second electrode is formed to cover not only an upper surface, but also a side surface of said emission layer;
   a peripheral electrode, arranged to enclose the outer periphery of said second electrode and connected with at least three edges of the outer periphery of said second electrode, having a smaller sheet resistance value than said second electrode; and
   a current source connection terminal connected to the outer periphery of said peripheral electrode, wherein said emission layer includes an organic layer.

4. A display comprising:
   a first electrode formed on a substrate;
   an emission layer formed on said first electrode;
   a second electrode formed on said emission layer, the second electrode is formed to cover not only an upper surface, but also a side surface of said emission layer;
   a peripheral electrode, arranged to enclose the outer periphery of said second electrode and connected with at least three edges of the outer periphery of said second electrode, having a smaller sheet resistance value than said second electrode; and
   a current source connection terminal connected to the outer periphery of said peripheral electrode, wherein the display includes a plurality of pixels.

* * * * *